(12) United States Patent
Kido

(10) Patent No.: US 7,214,473 B2
(45) Date of Patent: *May 8, 2007

(54) METHOD FOR REMOVING PATTERNED LAYER FROM LOWER LAYER THROUGH REFLOW

(75) Inventor: Shusaku Kido, Kagoshima (JP)

(73) Assignee: NEC LCD Technologies, Ltd., Kawasaki, Kanagawa (JP)

( * ) Notice: Subject to any disclaimer, the term of this patent is extended or adjusted under 35 U.S.C. 154(b) by 341 days.

This patent is subject to a terminal disclaimer.

(21) Appl. No.: 10/773,272

(22) Filed: Feb. 9, 2004

(65) Prior Publication Data

US 2004/0157171 A1 Aug. 12, 2004

Related U.S. Application Data

(63) Continuation of application No. 10/035,222, filed on Jan. 4, 2002, now Pat. No. 6,756,187.

(51) Int. Cl.
*G03F 7/26* (2006.01)

(52) U.S. Cl. ................. 430/322; 430/330; 430/329

(58) Field of Classification Search ............... 430/311, 430/322, 327–330
See application file for complete search history.

(56) References Cited

U.S. PATENT DOCUMENTS

| | | | |
|---|---|---|---|
| 5,716,891 A | 2/1998 | Kodama | |
| 5,865,365 A | 2/1999 | Nishikawa et al. | |
| 6,210,846 B1 | 4/2001 | Rangarajan | |
| 6,756,187 B2 * | 6/2004 | Kido | 430/322 |

2001/0041455 A1 11/2001 Yun et al.

FOREIGN PATENT DOCUMENTS

| | | |
|---|---|---|
| EP | 0 345 757 | 12/1989 |
| EP | 0 663 690 A2 | 7/1995 |
| JP | 63-271933 | 11/1988 |
| JP | 04-028219 | 1/1992 |
| JP | 06-193698 | 7/1994 |
| JP | 06-224168 | 8/1994 |
| JP | 07-066119 | 3/1995 |
| JP | 10-027771 | 1/1998 |
| JP | 2000-147793 | 5/2000 |
| JP | 2000-183036 | 6/2000 |
| JP | 2001-290287 | 10/2001 |
| KR | 1999-0074758 | 10/1999 |
| KR | 2001-46789 | 6/2001 |
| WO | WO 00/12231 | 3/2000 |

OTHER PUBLICATIONS

Japanese Office Action dated Sep. 9, 2003 with partial English translation.
Japanese Office Action dated Feb. 12, 2003 with partial English translation.
Korean Office Action dated Nov. 17, 2003 with a partial English translation.

* cited by examiner

*Primary Examiner*—Kathleen Duda
(74) *Attorney, Agent, or Firm*—McGinn IP Law Group PLLC

(57) ABSTRACT

A photo-resist mask of organic compound is stripped off after the pattern transfer to a layer thereunder, wherein the photo-resist mask is firstly exposed to vapor of organic solvent for reducing the thickness through a reflow, and, thereafter, the photo-resist mask is ashed in an oxygen plasma, whereby the dry ashing is completed within a short time period by virtue of the reduction of thickness.

31 Claims, 2 Drawing Sheets

METHOD FOR REMOVING PATTERNED LAYER FROM LOWER LAYER THROUGH REFLOW

The present Application is a Continuation Application of U.S. patent application Ser. No. 10/035,222, filed on Jan. 4, 2002 now U.S. Pat. No. 6,756,187.

FIELD OF THE INVENTION

This invention relates to a pattern transfer technology and, more particularly, to a method for removing a patterned layer of organic compound from a lower layer such as, for example, a wafer or substrate.

DESCRIPTION OF THE RELATED ART

Upon completion of pattern transfer to a lower layer, the photo-resist mask is removed from the lower layer such as a semiconductor wafer through a suitable cleaning technique. The photo-resist mask is formed of organic compound. The cleaning techniques are broken down into two categories, i.e., a dry cleaning and a wet cleaning. A dry ashing is a typical example of the dry cleaning technique. The photo- resist mask of organic compound is exposed to oxygen plasma or ozone under radiation of ultra-violet. Then, the photo-resist mask is decomposed and, accordingly, is removed from the semiconductor wafer.

On the other hand, dipping into chemical solution is a typical example of the wet cleaning. The photo-resist mask is dipped into the chemical solution so that the organic compound is dissolved into the chemical solution.

A compromise between the dry cleaning and the wet cleaning includes a preliminary treatment before the dry ashing. The semiconductor wafer covered with the photo-resist mask is dipped into chemical solution, or is exposed to the chemical solution. The preliminary treatment makes the time consumed for the dry ashing.

When the manufacturer decides to remove the photo-resist mask from the semiconductor wafer only through the dry ashing, which is hereinbelow referred to as "full dry ashing", the photo-resist mask is continuously exposed to the dry cleaner, and are gradually ashed. The thicker the photo-resist mask is, the longer the exposure time is. For this reason, the full dry ashing on a thick photo-resist mask is time consuming, and is a neck of the process for fabricating semiconductor devices. Thus, a problem inherent in the full dry ashing is a low throughput.

Problems inherent in the wet cleaning are a large amount of waste chemical solution and inefficient usage of chemical solution. The residual chemical solution is to be rinsed in pure water, and a large amount of waste water is left. The cost and anti-pollution measure for the waste chemical solution/waste water are yet another problem. The time consumed in the wet cleaning is dependent on the organic compound. If the organic compound layer is strongly adhered to the semiconductor wafer, an additional time period is required for the wet cleaning. Thus, the wet cleaning is not always speedy.

A problem inherent in the compromise is residual chemical solution on the semiconductor wafer. Rinsing is required for semiconductor wafer after the preliminary treatment. Thus, a problem inherent in the compromise is the complicated process sequence. Another problem is residual contaminant left on the semiconductor wafer. The problems of the wet cleaning are also inherent in the compromise.

SUMMARY OF THE INVENTION

It is therefore an important object of the present invention to provide a method for removing an organic layer, which is large in throughput, economical and almost free from the residual contaminant.

To accomplish the object, the present invention proposes to reduce an organic compound layer in thickness through a preliminary treatment.

In accordance with one aspect of the present invention, there is provided a method for removing an organic compound layer from a lower layer comprising the steps of carrying out a preliminary treatment on the organic compound layer so as to deform the organic compound layer or change quality of the organic compound, and peeling the organic compound layer from said lower layer.

BRIEF DESCRIPTION OF THE DRAWINGS

The features and advantages of the method will be more clearly understood from the following description taken in conjunction with the accompanying drawings in which.

DESCRIPTION OF THE PREFERRED EMBODIMENTS

Figure 1A:
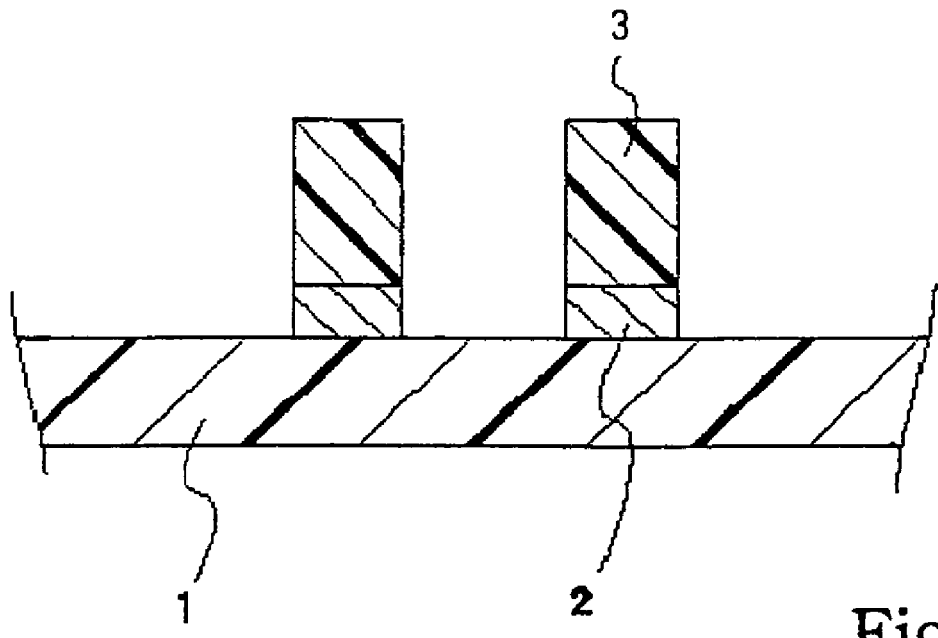
FIGS. 1A and 1B are schematic cross sectional views showing a method for removing a patterned organic compound layer from a substrate according to the present invention.

A method for removing a patterned organic compound layer embodying the present invention includes a preliminary treatment before a dry cleaning or wet cleaning. The patterned organic compound layer is assumed to be a patterned photo-resist layer formed on a substrate.

The preliminary treatment is to expose the patterned photo-resist layer on the substrate to vapor of organic solvent. The organic solvent vapor penetrates into the patterned photo-resist layer. However, the influence of the organic solvent vapor on a patterned layer on the substrate is negligible. The patterned photo-resist layer is partially dissolved in the presence of the organic solvent vapor, and is softened. Finally, the patterned photo-resist layer is reflowed. As a result, the photo-resist layer is spread over the substrate, and is reduced in thickness to a fifth of the patterned photo-resist layer or less. In fact, the photo-resist layer is reduced in thickness to a tenth of the patterned photo-resist layer or less when the organic solvent vapor and the time to reflow it are appropriately regulated.

Another preliminary treatment before the dry or wet cleaning is to soften the patterned photo-resist layer by applying heat. In detail, when the substrate reaches 50 degrees to 300 degrees in centigrade, the patterned photo-resist layer is softened, and is reflowed. The photo-resist layer is spread over the substrate, and is reduced in thickness.

Yet another preliminary treatment before the dry or wet cleaning is the combination of the exposure to organic solvent vapor and the heating. The photo-resist layer is widely spread over the substrate, and, accordingly, is reduced in thickness.

Still another preliminary treatment before the dry or wet cleaning includes an additional heat treatment or drying in vacuum after the exposure to the organic solvent vapor. The additional heat treatment and drying aim at elimination of residual organic solvent from the photo-resist layer through vaporization. The heat treatment for the elimination of the residual organic solvent is carried out 100–180 degrees in centigrade, and is continued for 10 minutes to 300 minutes.

After the preliminary treatment, the photo-resist layer is removed from the substrate through a dry-cleaning or wet cleaning. The dry cleaning is, by way of example, an oxygen plasma ashing or exposure to ozone under radiation of ultraviolet light.

As described hereinbefore, the time consumed in the dry cleaning is dominated by the thickness of the photo-resist layer. The area of the photo-resist layer is less influential on the dry cleaning. The photo-resist layer has been already reduced in thickness through the preliminary treatment. For this reason, the time required for the dry cleaning is shorter than the time period consumed in the full dry ashing. As a result, the throughput is improved. Thus, the method for removing a patterned organic layer according to the present invention is conducive to elimination of the neck in the process for fabricating semiconductor devices.

The preliminary treatment with the organic solvent is preferable from another viewpoint. In case that the photo-resist layer has been cured, the reflow less occur. Even so, the organic solvent is effective to the cured photo-resist layer, because the organic solvent makes the cured photo-resist layer much liable to be peeled off through a change of quality.

The preliminary treatment accelerates the wet cleaning, and the time consumed in the wet etching is shortened. Thus, the throughput is improved by virtue of the preliminary treatment in case where the wet cleaning is employed.

Figure 1B:
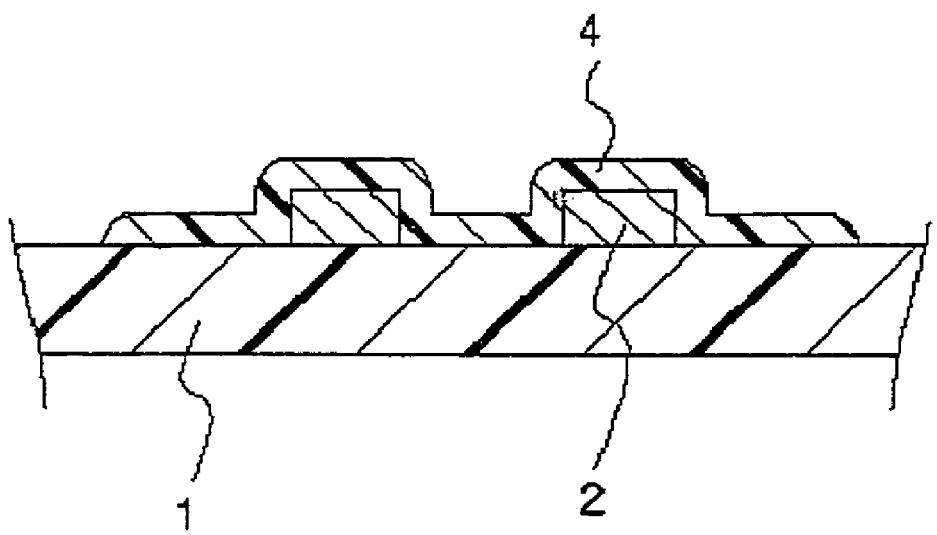

FIGS. 1A and 1B shows a sequence of the method according to the present invention. An insulating substrate 1 is covered with a conductive layer 2 to be etched. A patterned photo-resist layer 3 is prepared as follows. First, the conductive layer 2 is covered with a photo-resist layer of organic compound. The photo-resist layer is exposed to an image-carrying light. Then, a latent image is produced in the photo-resist layer. The latent image is developed. Then, the photo-resist is partially removed from the photo-resist layer, and the patterned photo-resist layer 3 is left on the conductive layer 2. The patterned photo-resist layer is of the order of 2 microns thick.

Using the patterned photo-resist layer 3, the conductive layer 2 is selectively etched. Thus, the pattern is transferred to the conductive layer 2, and the patterned conductive layer 2 is left on the insulating substrate 1 as shown in FIG. 1A.

After the pattern transfer to the conductive layer, the patterned photo-resist layer 3 is removed from the resultant structure through the method according to the present invention. First, the patterned photo-resist layer 3 is reflowed through the preliminary treatment. The patterned photo-resist layer 3 is spread over the insulating substrate 1, and is reduced in thickness. The photo-resist layer reflowed in the preliminary treatment is designated by reference numeral 4 in FIG. 1B.

In detail, the insulating substrate 1 and, accordingly, the photo-resist layer 4 are exposed to vapor of organic solvent at 15 degrees to 40 degrees in centigrade. The organic solvents available for the preliminary solvent are
alcohols expressed as R—OH,
alkoxyalcohols,
ethers expressed as R—O—R, Ar—O—R and —Ar—O—Ar,
esters,
ketones,
glycols,
alkylene glycols and
glycol ethers where R is alkyl group or substituted alkyl group and Ar is phenyl group or aromatic ring except phenyl group. Examples of the organic solvents are listed in paragraphs (1), (2) and (3).

(1) alcohols expressed as $CH_3OH$, $C_2H_5OH$, $CH_3(CH_2)_x OH$, by way of example;
isopropyl alcohol (IPA), ethoxy ethanol, methoxy alcohol, long chain alkyl ester, monoethanol amine (MEA), acetone, acetylacetone, dioxan, ethyl accetate, buthyl accetate, toluene, methyl ethyl ketone (MEK), diethyl ketone, dimethyl sulfoxide (DMSO), methylisobuthylketone (MIBK), buthyl carbitol, n-buthyl acetate (nBA), γ-butyrolactone, ethylcellsolveacetate (ECA), lactic ethyl, pyruvic ethyl, 2-heptanone (MAK), 3-methoxybuthyl acetate, ethylene glycol, propylene glycol, butylene glycol, ethylene glycol monoethylether, diethylene glycol monoethylether, ethylene glycol monoethylether acetate, ethylene glycol monomethylether, ethylene glycol monomethylether acetate, ethylene glycol mono-n-buthylether, polyethylene glycol, polypropylene glycol, polybutylene glycol, polyethylene glycol monoethylether, polydiethylene glycol monoethylether, polyethylene glycol monoethylether acetate, polyethylene glycol monomethylether, polyethylene glycol monomethylether acetate and polyethylene glycol mono-n-buthylether;

(2) methyl-3-methoxy propionate (MMP), propylene glycol monomethylether (PGME), prolylene glycol monoinethylether acetate (PGMEA), propylene glycol monopropylether (PGP) and propylene glycol monoethylether (PGEE);

(3) ethyl-3-ethoxypropionate (FEP), dipropylene glycol monoethylether, tripropylene glycol monoethylether, polypropylene glycol monoethylether, propylene glycol monomethylether propionate, 3-methoxy methyl propionate, 3-ethoxy methyl propionate, 3-ethoxy ethyl propionate and N-methyl-2-pyrrolinone (NMP).

Above-described organic solvents may be blended. Examples of the blended organic solvent are as follows. Recommendable blending ratio is put in the parentheses.
PGMEA:butyl acetate=8:2
Lactic ethyl:butyl acetate=8:2
Lactic ethyl:butyl acetate=9:1
Lactic ethyl:PGMEA=7:3
MAK:γ-butyrolactone=9.5:0.5
MAK:PGP=8:2
PGMEA:PGP=7:3
MAK:lactic ethyl=5:5
PGMEA:dipropylene glycol monoethylether=7:3
PGMEA:lactic ethyl=8:2
PGME:PGMEA=7:3
3-methoxybuthyl acetate:PGMEA=7:3
3-methoxybuthyl acetate:butyl acetate=6:4
PGMEA:lactic ethyl=6:4

Thus, the organic solvents are selectively blended for use in the method according to the present invention as well as any one of the organic solvent solely used.

The present inventor confirmed that organic compound layers were reduced in thickness in the presence of vapor of the organic solvent and vapor of the mixture thereof. The present inventor prepared samples of the patterned photo-resist layer laminated on the conductive layer, which had been already formed on the insulating substrate as follows. First, liquid resist was spun onto a conductive layer formed on an insulating substrate. The liquid resist was composed of polymer compound, photo-sensitive material and other additives. The organic compound of the photo-resist was in polyvinyl series such as polyvinyl cinnamate ester. Other kinds of photo-resist were further investigated. The organic compound of another kind of photo-resist was in rubber series, i.e., cyclic polyisoprene/cyclic polybutadiene and bis-axido compound. Other kinds of photo-resist were novolak resin series, i.e., mixture of cresol novolak resin and naphthoquinonediazido-5-sulfonic acid ester and copolymer of acrylic acid series, i.e., polyacrylamide and polyamido acid. The present inventor further investigated photo-resist containing bromine/iodine, several kinds of photo-resist. produced on the basis of both organic and inorganic materials and each containing one of siloxane, polysiloxane, polysilane, polysiline and carbosilane and photo-resist containing metal such as germanium. Positive photo-resist was in the novolak resin series, i.e., mixture of cresol novolak resin and naphthoquinonediazido-5-sulfonic acid ester. Negative photo-resist was in the rubber series, i.e., cyclic polyisoprene/cyclic polybutadiene and bis-axido compound. The photo-resist was baked. A pattern image was transferred from a photo-mask to the photo-resist layer, and a latent image was formed in the photo-resist layer. The latent image was developed so as to form the patterned photo-resist layer. The patterned photo-resist layers of the samples were 2 microns thick. Using the patterned photo-resist layers, the conductive layers were etched. The photo-resist layers on some samples were seriously damaged during the dry etching, and were hardened. When the inventor exposed the patterned photo-resist layer of one sample to vapor containing acetone, the following phenomena were observed.

Nitrogen gas, $N_2$ gas was bubbled in the organic solvent. Then, the acetone was carried on the nitrogen gas. The acetone-containing vapor was introduced into a chamber where the sample was placed. The total pressure in the chamber was −5 KPa to +10 KPa. The sample was maintained at 20 degrees to 30 degrees in centigrade. The acetone-carrying gas was introduced at 5–10 litter/min. The substrate temperature was fallen within the range from 15 degrees to 40 degrees in centigrade. The acetone gradually penetrated into the patterned photo-resist layer, and the patterned photo-resist mask was partially dissolved in the vapor. The patterned photo-resist layer was reflowed over the substrate. Accordingly, the thickness of the patterned photo-resist layer was reduced with time. When the patterned photo-resist layer was exposed to the vapor for 30 seconds, the patterned photo-resist layer was reduced to a half of the original thickness, i.e., 1 micron thick. When sixty seconds were expired, the patterned photo-resist layer was reduced to a fifth of the original thickness, i.e., 400 nanometers thick. The present inventor continued the observation, and confirmed that the patterned photo-resist layer reached a tenth of the original thickness.

The present inventor further confirmed that the patterned photo-resist layer was reduced in thickness through a reflow in the high-temperature ambience. The present inventor heated the insulating substrate to 50 degrees to 300 degrees in centigrade. The insulating substrate was maintained over 140 degrees in centigrade for 30 minutes to 300 minutes. The patterned photo-resist layer was thermally softened, and was reflowed. The patterned photo-resist layer was reduced in thickness. The present inventor confirmed that the photo-resist layer was reduced in thickness to a half of the original thickness.

The present inventor further confirmed that the patterned photo-resist layer was reduced in thickness through the combination of the exposure to the vapor containing the organic solvent or solvents and the heat application.

The present inventor further confirmed that all kinds of photo-resist were reduced in thickness through the exposure to the organic solvent. Although the photo-resist layers with the hard surface portion were not reduced in thickness, the organic solvent vapor penetrated into the photo-resist layers, and made the photo-resist layers easily peel off.

After the reflow through the exposure to the vapor, the present inventor dried the samples at 180–100 degrees in centigrade or less for 10–300 minutes. The present inventor also dried other samples in vacuum for 2–10 minutes. The present inventor confirmed that organic solvent was almost perfectly removed from the samples.

Figure 2:
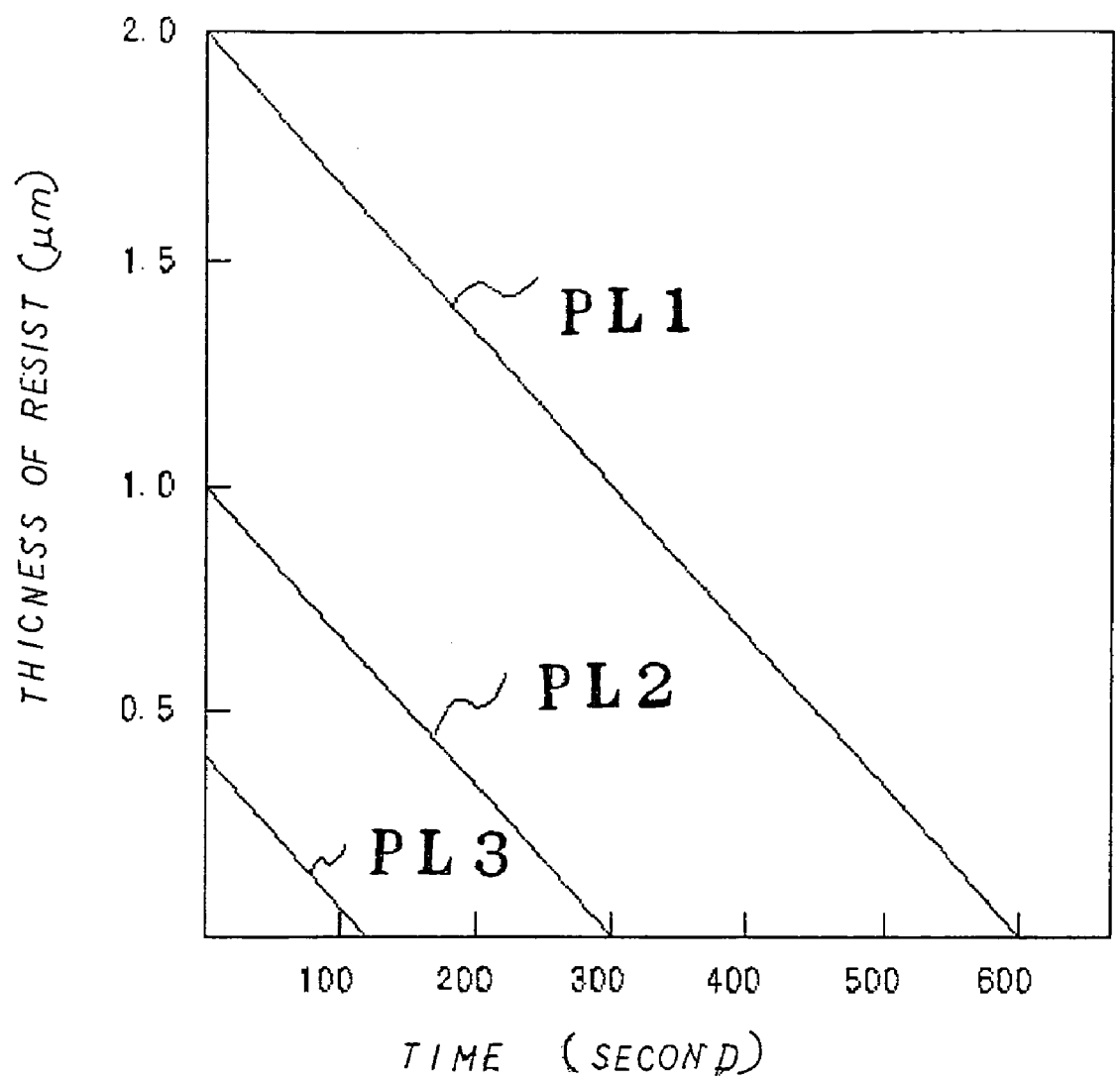
FIG. 2 is a graph showing a time dependency of an ashing step.

Upon completion of the reflow through the exposure to the vapor of organic solvent, the present inventor measured a time to be required for peeling the patterned photo-resist off. The present inventor prepared the samples exposed to the vapor of organic solvent for different time periods and a comparative sample, the patterned photo-resist of which was not reflowed. The photo-resist layers on the samples were ashed in oxygen plasma at 10 Pa for 10–60 minuates. Oxygen was supplied at 500 sccm, and the rf power was 1000 watts. The photo-resist layer on the comparative sample was reduced in thickness as indicated by plots PL1 in FIG. 2. 600 seconds were required for the comparative sample. On the other hand, plots PL2 and PL3 were representative of the samples, the photo-resist layers of which were exposed to the vapor of the organic solvent for 30 seconds and 60 seconds, respectively. The photo-resist layers are removed from the samples at 300 seconds and 120 seconds, respectively. Thus, the time required for the ashing was drastically reduced by virtue of the reflow in the vapor of organic solvent.

As will be understood from the foregoing description, the major advantage of the method according to the present invention is to shorten the time to be required for the dry/wet peeling by virtue of the reduction in thickness of the organic compound layer. When the organic compound layer is dry ashed, the reduction in thickness drastically accelerates the dry ashing.

Another advantage of the exposure to the vapor of organic solvent according to the present invention is to enhance the peel-off property of the organic layer. The organic compound layer was exposed to vapor of organic solvent at 15 degrees to 40 degrees in centigrade. The organic solvent vapor penetrated into only the organic compound layer such as the photo-resist layer. The organic solvent thus penetrating into the organic compound layer changed the quality of the organic compound layer, and the reflow took place inside the organic compound layer. As a result, the organic compound layer was much liable to peel off from the lower layer. The organic solvent vapor hardly penetrated into the insulating substrate and the layer under the organic compound layer. Although the organic solvent vapor was condensed on the lower layer, the organic solvent was vaporized, again, and residual organic solvent was negligible. For this reason, the rinsing was not required after the removal of the organic compound layer. Thus, the method according to the present invention is simpler than the conventional methods.

The present inventor confirmed that NMP and γ-butyrolactone accelerated the peel-off between organic compound layers and compound layers.

Yet another advantage of the method according to the present invention is reduction in consumption of chemical solutions. The conventional wet cleaning consumes a large amount of chemical solution, and the waste chemical solution tends to pollute the environment. In the method according to the present invention, the organic solvent is vaporized. The consumption of the organic solvent is a little. For this reason, the method according to the present invention is economical and small in environmental influence rather than the conventional wet cleaning techniques.

Still another advantage of the method according to the present invention is a completely dry process. Not only preliminary treatment but also ashing are dry, and the dry process makes the cost, consumption of chemicals and environmental influence small.

Although particular embodiments of the present invention have been shown and described, it will be apparent to those skilled in the art that various changes and modifications may be made without departing from the spirit and scope of the present invention.

The present invention is applicable to various combinations between the organic compounds and organic solvents. The organic compound may not have the sensitivity to light. The method according to the present invention may be applied to an organic compound layer containing any material in the organic compound series and organic solvent and another compound layer containing any material in the inorganic series and organic solvent. Examples of the former are the resist layer, synthetic resin such as, for example, acrylic resin, polyimide resin and polyacrylic amido resin, and an organic high-molecular weight compound. Examples of the latter are siloxane, polysiloxane, polysilane, polysiline, carbosilane, silicone and inorganic glass. The organic solvents described herienbefore are available for both of the organic compound layers. However, it is recommendable to select the optimum organic solvent from the candidates.

What is claimed is:

1. A process for treating a substrate comprising:
forming a patterned organic layer on said substrate; and
reflowing said patterned organic layer at a substrate temperature from 15 degrees to 40 degrees centigrade while being exposed to an organic solvent-carrying gas.

2. The process as set forth in claim 1, wherein a deformed organic layer is formed from said patterned organic layer in said reflowing, and said deformed organic layer is thinner than said patterned organic layer.

3. The process as set forth in claim 2, wherein said deformed organic layer has a thickness that is equal to or less than one of one-fifth, one-tenth and one-half of the thickness of said patterned organic layer.

4. The process as set forth in claim 3, wherein a chemical solution is penetrated into said patterned organic layer so as to dissolve part of said patterned organic layer, thereby reflowing said patterned organic layer.

5. The process as set forth in claim 3, wherein a chemical solution is penetrated into said patterned organic layer so as to dissolve part of said patterned organic layer for the reflowing, and heat is applied to said patterned organic layer so as to reflow part of said patterned organic layer.

6. The process as set forth in claim 3, wherein said patterned organic layer comprises a resist layer.

7. The process as set forth in claim 2, wherein a chemical solution is penetrated into said patterned organic layer so as to dissolve part of said organic layer, thereby reflowing said patterned organic layer.

8. The process as set forth in claim 2, wherein a chemical solution is penetrated into said patterned organic layer so as to dissolve part of said patterned organic layer for the reflowing, and heat is applied to said patterned organic layer so as to reflow part of said patterned organic layer.

9. The process as set forth in claim 2, wherein said patterned organic layer comprises a resist layer.

10. The process as set forth in claim 1, wherein a chemical solution is penetrated into said patterned organic layer so as to dissolve part of said organic layer, thereby reflowing said patterned organic layer.

11. The process as set forth in claim 10, wherein said patterned organic layer is exposed to a gaseous mixture of organic solution comprising an organic solvent for making said chemical solution penetrate into said patterned organic layer.

12. The process as set forth in claim 11, wherein a temperature of said gaseous mixture ranges from 15 degrees to 40 degrees centigrade.

13. The process as set forth in claim 12, wherein a deformed organic layer produced from said patterned organic layer is thinner than said patterned organic layer after the reflowing through the dissolution.

14. The process as set forth in claim 12, wherein said patterned organic layer comprises a resist layer.

15. The process as set forth in claim 11, wherein a deformed organic layer produced from said patterned organic layer is thinner than said patterned organic layer after the reflowing through the dissolution.

16. The process as set forth in claim 11, wherein said chemical solution or said organic solution including said organic solvent comprises an organic solution comprising an organic solvent selected from the group consisting of alcohols expressed by a general formula of R—OH, alkoxyalcohols, ethers expressed by a general formula of R—O—R, Ar—O—R. and Ar—O—Ar, esters, ketones, glycols, alkylene glycols, and glycol ethers where R is an alkyl group or a substituted alkyl group and Ar comprises a phenyl group or an aromatic ring other than said phenyl group.

17. The process as set forth in claim 11, wherein said patterned organic layer comprises a resist layer.

18. The process asset forth in claim 10, wherein a deformed organic layer produced from said patterned organic layer is thinner than said patterned organic layer after the reflowing through the dissolution.

19. The process as set forth in claim 18, wherein said patterned organic layer comprises a resist layer.

20. The process as set forth in claim 10, wherein said chemical solution or said organic solution including said organic solvent comprises an organic solution comprising an organic solvent selected from the group consisting of alcohols expressed by a general formula of R—OH, alkoxyalcohols, ethers expressed by a general formula of R—O—R, Ar—O—R and Ar—O—Ar, esters, ketones, glycol s, alkylene glycols, and glycol ethers where R is an alkyl group or a substituted alkyl group and Ar comprises a phenyl group or an aromatic ring other than said phenyl group.

21. The process as set forth in claim 20, wherein said patterned organic layer comprises a resist layer.

22. The process as set forth in claim 10, wherein said patterned organic layer comprises a resist layer.

23. The process as set forth in claim 1, wherein a chemical solution is penetrated into said patterned organic layer so as dissolve part of said patterned organic layer for the reflowing, and heat is applied to said patterned organic layer so as to reflow part of said patterned organic layer.

24. The process as set forth in claim 23, wherein the process further comprises exposing said patterned organic layer to a high-temperature ambient at 50–300 degrees centigrade for applying the heat.

25. The process as set forth in claim 24, wherein a deformed organic layer produced from said patterned organic layer is thinner than said patterned organic layer after the reflowing through the dissolution.

26. The process as set forth in claim 24, wherein said patterned organic layer comprises a resist layer.

27. The process as set forth in claim 23, wherein said patterned organic layer is exposed to a gaseous mixture of organic solution comprising an organic solvent for making said chemical solution penetrate into said patterned organic layer.

28. The process as set forth in claim 23, wherein a deformed organic layer produced from said patterned organic layer is thinner than said patterned organic layer after the reflowing through the dissolution.

29. The process as set forth in claim 23, wherein said chemical solution or said organic solution including said organic solvent comprises an organic solution comprising an organic solvent selected from the group consisting of alcohols expressed by a general formula of R—OH, ailcoxyalcohols, ethers expressed by a general formula of R—O—R, Ar—O—R and Ar—O—Ar, esters, ketones, glycols, alkylene glycols, and glycol ethers where R is an alkyl group or a substituted alkyl group and Ar comprises a phenyl group or an aromatic ring other than said phenyl group.

30. The process as set forth in claim 23, wherein said patterned organic layer comprises a resist layer.

31. The process as set forth in claim 1, wherein said patterned organic layer comprises a resist layer.

* * * * *